(12) United States Patent
Yamazaki et al.

(10) Patent No.: US 8,742,660 B2
(45) Date of Patent: Jun. 3, 2014

(54) LIGHT-EMITTING DEVICE

(75) Inventors: Shunpei Yamazaki, Tokyo (JP);
Junichiro Sakata, Kanagawa (JP);
Kaoru Tsuchiya, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 20 days.

(21) Appl. No.: 13/034,871

(22) Filed: Feb. 25, 2011

(65) Prior Publication Data

US 2011/0140598 A1 Jun. 16, 2011

Related U.S. Application Data

(63) Continuation of application No. 10/967,143, filed on Oct. 19, 2004, now Pat. No. 7,902,747.

(30) Foreign Application Priority Data

Oct. 21, 2003 (JP) ................... 2003-361287

(51) Int. Cl.
*H01J 1/62* (2006.01)
(52) U.S. Cl.
USPC ............................ 313/506; 313/503; 313/509
(58) Field of Classification Search
USPC .................. 313/498–512; 315/169.1, 169.3; 428/690–691, 917; 438/26–29, 34, 82; 257/40, 72, 98–100, 642–643, 759; 427/66, 532–535, 539
See application file for complete search history.

(56) References Cited

U.S. PATENT DOCUMENTS

| | | | |
|---|---|---|---|
| 5,294,810 | A | 3/1994 | Egusa et al. |
| 5,640,067 | A | 6/1997 | Yamauchi et al. |
| 5,744,824 | A | 4/1998 | Kousai et al. |
| 6,111,274 | A | 8/2000 | Arai |
| 6,222,314 | B1 | 4/2001 | Arai et al. |
| 6,284,394 | B1 | 9/2001 | Arai et al. |

(Continued)

FOREIGN PATENT DOCUMENTS

| | | |
|---|---|---|
| CN | 1420568 A | 5/2003 |
| EP | 1128436 A1 | 8/2001 |

(Continued)

OTHER PUBLICATIONS

C.W. Tang et al.; "Electroluminescence of doped organic thin films"; J. Appl. Phys., vol. 65, No. 9; pp. 3610-3616; May 1, 1989.

(Continued)

*Primary Examiner* — Anh Mai
*Assistant Examiner* — Fatima Farokhrooz
(74) *Attorney, Agent, or Firm* — Fish & Richardson P.C.

(57) ABSTRACT

It is an object of the present invention is to provide a light-emitting device in which high luminance can be obtained with low power consumption by improving the extraction efficiency. A light-emitting device of the invention comprises an insulating film, a plurality of first electrodes being in contact with the insulating film and formed on the insulating film to be in parallel, an electroluminescent layer formed over the plurality of first electrodes, and a plurality of second electrodes intersecting with the plurality of first electrodes and formed over the electroluminescent layer in parallel, wherein the insulating film contains nitrogen and silicon and the first electrodes contain a conductive transparent oxide material and silicon oxide.

16 Claims, 14 Drawing Sheets

(56) References Cited

U.S. PATENT DOCUMENTS

| | | |
|---|---|---|
| 6,399,222 B2 | 6/2002 | Arai et al. |
| 6,416,888 B1 | 7/2002 | Kawamura et al. |
| 6,448,580 B1 | 9/2002 | Arai et al. |
| 6,469,438 B2 | 10/2002 | Fukuoka et al. |
| 6,492,778 B1 | 12/2002 | Segawa |
| 6,515,310 B2 | 2/2003 | Yamazaki et al. |
| 6,541,918 B1 | 4/2003 | Yudasaka |
| 6,614,174 B1 | 9/2003 | Urabe et al. |
| 6,680,577 B1 | 1/2004 | Inukai et al. |
| 6,716,662 B2 | 4/2004 | Akai |
| 6,734,671 B2 | 5/2004 | Murata et al. |
| 6,794,278 B2 | 9/2004 | Kido et al. |
| 6,833,560 B2 | 12/2004 | Konuma et al. |
| 6,836,070 B2 | 12/2004 | Chung et al. |
| 6,844,210 B2 | 1/2005 | Fukuoka et al. |
| 6,852,997 B2 | 2/2005 | Yamazaki et al. |
| 6,858,271 B1* | 2/2005 | Okada et al. .................. 428/1.4 |
| 6,897,607 B2 | 5/2005 | Sugimoto et al. |
| 6,906,458 B2 | 6/2005 | Kobayashi |
| 6,909,409 B2 | 6/2005 | Tanada |
| 6,911,163 B2 | 6/2005 | Abe |
| 7,015,640 B2 | 3/2006 | Schaepkens et al. |
| 7,057,208 B2 | 6/2006 | Akimoto et al. |
| 7,125,503 B2 | 10/2006 | Abe |
| 7,132,693 B2 | 11/2006 | Konuma et al. |
| 7,183,580 B2 | 2/2007 | Hayashi et al. |
| 7,294,517 B2 | 11/2007 | Takayama et al. |
| 7,488,986 B2 | 2/2009 | Yamazaki et al. |
| 7,492,090 B2 | 2/2009 | Yamazaki et al. |
| 7,732,824 B2 | 6/2010 | Konuma et al. |
| 2001/0004190 A1* | 6/2001 | Nishi et al. .................. 313/506 |
| 2001/0026125 A1* | 10/2001 | Yamazaki et al. ........... 313/505 |
| 2002/0038889 A1 | 4/2002 | Yamazaki et al. |
| 2002/0053871 A1 | 5/2002 | Seo |
| 2002/0093285 A1 | 7/2002 | Sugimoto et al. |
| 2002/0098628 A1 | 7/2002 | Hamada et al. |
| 2002/0113241 A1 | 8/2002 | Kubota et al. |
| 2002/0134981 A1 | 9/2002 | Nakamura et al. |
| 2002/0153831 A1 | 10/2002 | Sakakura et al. |
| 2003/0017360 A1 | 1/2003 | Tai et al. |
| 2003/0030369 A1* | 2/2003 | Shih et al. .................... 313/504 |
| 2003/0034497 A1* | 2/2003 | Yamazaki et al. ............. 257/86 |
| 2003/0044645 A1* | 3/2003 | Kambe et al. ................. 428/690 |
| 2003/0111666 A1 | 6/2003 | Nishi et al. |
| 2003/0117070 A1 | 6/2003 | Komatsu et al. |
| 2003/0127651 A1* | 7/2003 | Murakami et al. ............ 257/72 |
| 2003/0146439 A1 | 8/2003 | Yamazaki et al. |
| 2003/0164496 A1 | 9/2003 | Do et al. |
| 2003/0164674 A1 | 9/2003 | Imamura |
| 2003/0184221 A1 | 10/2003 | Mishima |
| 2003/0184222 A1 | 10/2003 | Nilsson et al. |
| 2003/0193056 A1 | 10/2003 | Takayama et al. |
| 2003/0194484 A1* | 10/2003 | Yamazaki et al. ............. 427/66 |
| 2003/0218153 A1* | 11/2003 | Abe .............................. 252/500 |
| 2003/0234607 A1* | 12/2003 | Kim et al. .................... 313/502 |
| 2003/0235935 A1 | 12/2003 | Yamazaki et al. |
| 2004/0004434 A1 | 1/2004 | Nishi et al. |
| 2004/0021415 A1 | 2/2004 | Vong et al. |
| 2004/0027507 A1 | 2/2004 | Iwakabe et al. |
| 2004/0029338 A1 | 2/2004 | Yamazaki et al. |
| 2004/0048100 A1 | 3/2004 | Ebisawa et al. |
| 2004/0066137 A1 | 4/2004 | Hayashi |
| 2004/0135151 A1 | 7/2004 | Okamoto et al. |
| 2005/0052127 A1 | 3/2005 | Sakata et al. |
| 2005/0082966 A1 | 4/2005 | Yamazaki et al. |
| 2005/0084994 A1 | 4/2005 | Yamazaki et al. |
| 2005/0093432 A1 | 5/2005 | Yamazaki et al. |
| 2005/0110020 A1 | 5/2005 | Hayashi et al. |
| 2005/0156519 A1 | 7/2005 | Yoshizawa et al. |
| 2005/0224766 A1 | 10/2005 | Abe |
| 2005/0224803 A1 | 10/2005 | Yamazaki et al. |
| 2005/0242714 A1 | 11/2005 | Chung et al. |
| 2005/0253131 A1 | 11/2005 | Kobayashi |
| 2005/0269943 A1 | 12/2005 | Hack et al. |
| 2006/0061268 A1 | 3/2006 | Nakanishi |
| 2006/0065894 A1 | 3/2006 | Jung et al. |
| 2007/0164671 A1 | 7/2007 | Yamazaki et al. |
| 2007/0259466 A1 | 11/2007 | Sakata et al. |
| 2012/0012887 A1 | 1/2012 | Yamazaki et al. |

FOREIGN PATENT DOCUMENTS

| | | |
|---|---|---|
| EP | 1376713 A2 | 1/2004 |
| EP | 1492387 A1 | 12/2004 |
| JP | 2000-012234 A | 1/2000 |
| JP | 2000223275 A | 8/2000 |
| JP | 2000-268954 A | 9/2000 |
| JP | 2001-076874 A | 3/2001 |
| JP | 2001-076882 A | 3/2001 |
| JP | 2001-312223 A | 11/2001 |
| JP | 3257913 B2 | 2/2002 |
| JP | 2002-169158 A | 6/2002 |
| JP | 2002-175879 A | 6/2002 |
| JP | 2002-231443 A | 8/2002 |
| JP | 2003-105532 A | 4/2003 |
| JP | 2003-114626 A | 4/2003 |
| JP | 2003-168556 A | 6/2003 |
| JP | 2003-203783 A | 7/2003 |
| JP | 2003-297551 A | 10/2003 |
| JP | 2003-297554 A | 10/2003 |
| JP | 2003-297575 A | 10/2003 |
| JP | 2004-087451 A | 3/2004 |

OTHER PUBLICATIONS

Chinese Office Action dated Sep. 7, 2007 for Application No. 200410098142.2, with English Translation, 28 pages.

Japanese Office Action dated May 11, 2010 for Application No. 2004-299587, with English Translation, 6 pages.

* cited by examiner

15

16

15  14 12  16

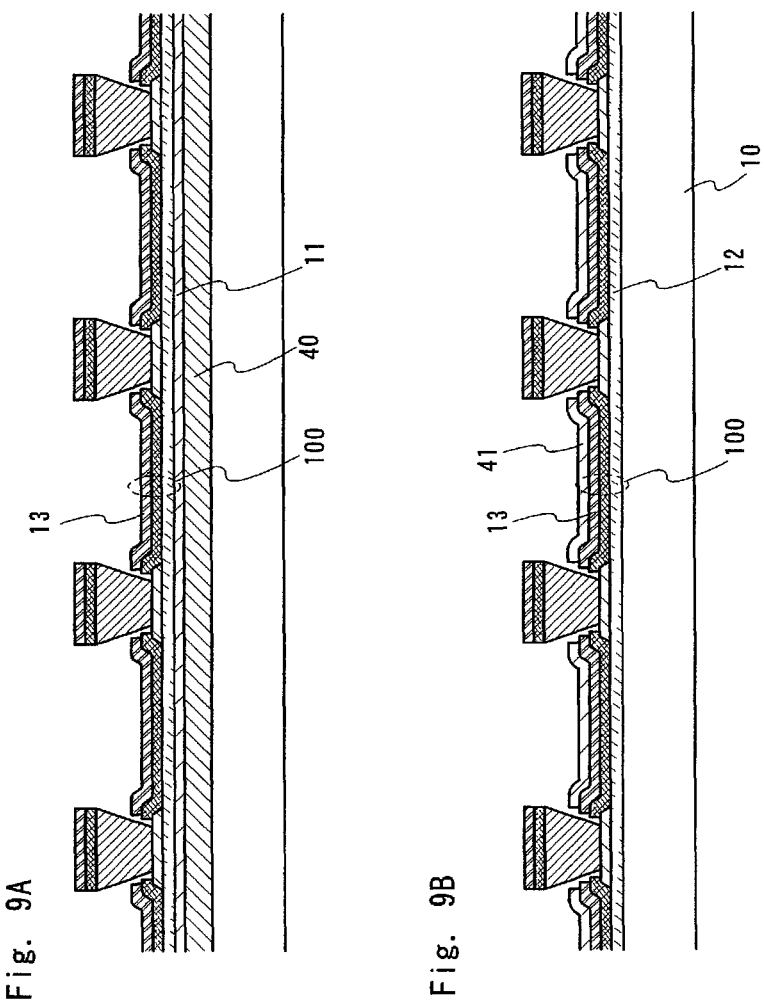

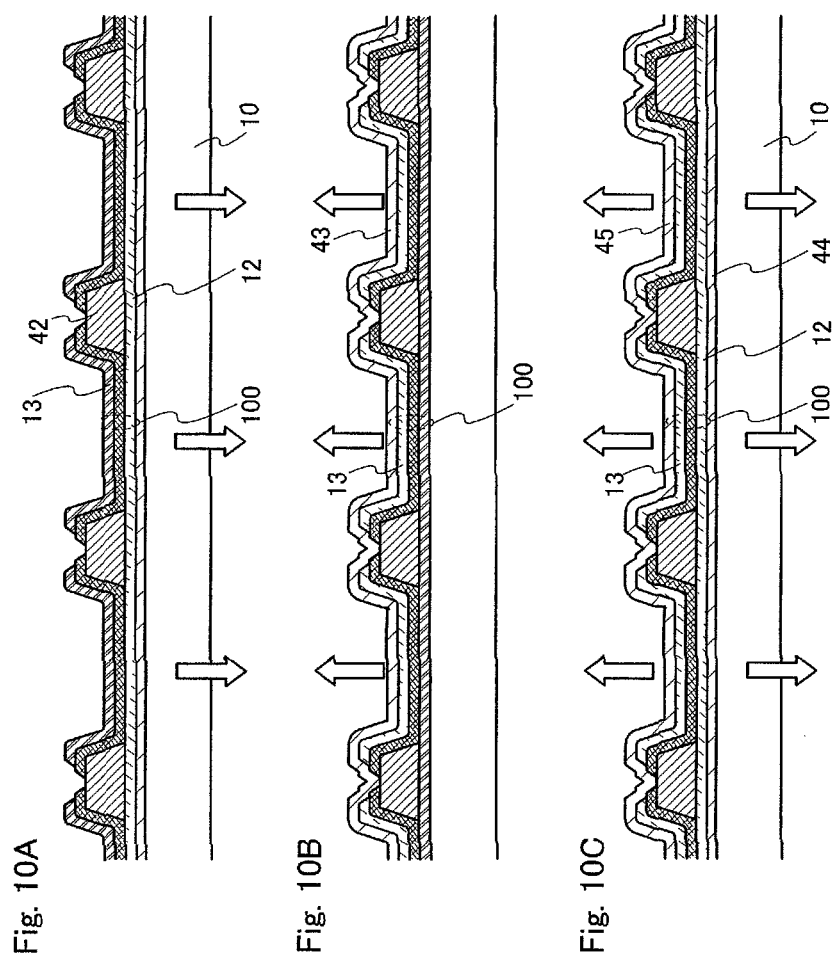

LIGHT-EMITTING DEVICE

CROSS-REFERENCE TO RELATED APPLICATIONS

This application is a continuation of U.S. application Ser. No. 10/967,143, filed Oct. 19, 2004, now allowed, which claims the benefit of a foreign priority application filed in Japan as Serial No. 2003-361287 on Oct. 21, 2003, both of which are incorporated by reference.

BACKGROUND OF THE INVENTION

1. Field of the Invention

The present invention relates to a light-emitting device having a light-emitting element in each pixel.

2. Description of the Related Art

A light-emitting element is highly visible since it emits light by itself, and has a feature that it does not need a backlight required for a liquid crystal display device (LCD), thereby being best suited for making the device thin, and besides, the viewing angle is wider than that of an LCD. Therefore, a light-emitting device using a light-emitting element draws attention as a display device that substitutes a CRT and an LCD and makes toward practical use. An OLED (Organic Light Emitting Diode), which is one of light-emitting elements, includes a layer containing an electroluminescent material that can obtain luminescence (Electroluminescence) by applying an electric field (hereinafter referred to as an electroluminescent layer), an anode, and a cathode. Luminescence can be obtained by combining a hole injected from the anode with an electron injected from the cathode in the electroluminescent layer.

Injection properties of a hole and an electron into an electroluminescent layer are assumed one index by a size of a work function of a material that forms an electrode. It is desirable that a material with a high work function is used for an electrode on the side a hole is injected (an anode), and a material with a low work function is used for an electrode on the side an electron is injected (a cathode). Specifically, indium tin oxide (ITO) of which work function is 5 eV is generally used for an anode.

As one mode of light-emitting devices that applied such a light-emitting element, a light-emitting device in which an electroluminescent layer is sandwiched between an electrode extending in one direction (parallel electrode) and an electrode extending in a direction intersecting with it (a column electrode) and then arranged in a matrix is known (see Reference 1: C. W. Tang, S. A. VanSlyke, and C. H. Chen, Journal of Applied Physics, vol. 65, p. 3610, 1989).

In the meantime, a backlight is not used for a light-emitting device; therefore, there is a high tendency that the total power consumption of the light-emitting device relies on a performance of a light-emitting element in each pixel. That is, low power consumption can be realized with high external quantum efficiency (the number of the photons externally extracted/the number of the injected carriers). The external quantum efficiency can be enhanced by improving the extraction efficiency (the number of the photons externally extracted/the number of the discharged photons).

However, a ratio of an area in which luminescence can be naturally obtained to an entire pixel portion (an aperture ratio) is decreased as the pixel is made to be higher precision. That is, it is considered that a relation between high precision and improvement of the extraction efficiency is tradeoff in some degree. As a result, it is difficult to increase the external quantum efficiency.

SUMMARY OF THE INVENTION

In view of the above-mentioned problems, it is an object of the present invention is to provide a light-emitting device in which high luminance can be obtained with low power consumption by improving the extraction efficiency.

The inventors focused that the extraction efficiency does not rely only on an aperture ratio but also on a combination of a material of an electrode included in a light-emitting element and a material of an insulating film being in contact with the electrode.

According to one aspect of the invention, a light-emitting device comprises an insulating film, a plurality of first electrodes being in contact with the insulating film and formed on the insulating film to be in parallel, an electroluminescent layer formed over the plurality of first electrodes, and a plurality of second electrodes intersecting with the plurality of first electrodes and formed over the electroluminescent layer in parallel, wherein the insulating film comprises nitrogen and silicon and the first electrodes comprise a conductive transparent oxide material and silicon oxide.

According to other aspect of the invention, a light-emitting device comprises a plurality of first electrodes formed in parallel on an insulating surface, an electroluminescent layer formed over the plurality of first electrodes, a plurality of second electrodes intersecting with the plurality of first electrodes and formed over the electroluminescent layer in parallel, and an insulating formed to be in contact with the plurality of second electrodes, wherein the insulating film comprises nitrogen and silicon and the second electrodes comprise a conductive transparent oxide material and silicon oxide.

According to other aspect of the invention, a light-emitting device comprises a first insulating film, a plurality of first electrodes being in contact with the first insulating film and formed on the first insulating film to be in parallel, an electroluminescent layer formed over the plurality of first electrodes, a plurality of second electrodes intersecting with the plurality of first electrodes and formed over the electroluminescent layer in parallel, and a second insulating film formed to be in contact with the plurality of second electrodes, wherein the first insulating film and the second insulating film comprise nitrogen and silicon and the second electrodes comprise a conductive transparent oxide material and silicon oxide.

According to other aspect of the invention, a light-emitting device comprises an interlayer insulating film, an insulating film formed on the interlayer insulating film, a plurality of first electrodes being in contact with the insulating film and formed on the insulating film to be in parallel, an electroluminescent layer formed over the plurality of first electrodes, and a plurality of second electrodes intersecting with the plurality of first electrodes and formed over the electroluminescent layer in parallel, wherein the insulating film comprises nitrogen and silicon and the first electrodes comprise a conductive transparent oxide material and silicon oxide.

According to other aspect of the invention, a light-emitting device comprises an interlayer insulating film, a first insulating film formed on the interlayer insulating film, a plurality of first electrodes being in contact with the first insulating film and formed on the first insulating film to be in parallel, an electroluminescent layer formed over the plurality of first electrodes, a plurality of second electrodes intersecting with the plurality of first electrodes and formed over the electroluminescent layer in parallel, and a second insulating film formed to be in contact with the plurality of second electrodes, wherein the second insulating film comprises nitrogen and silicon and the second electrodes comprises a conductive transparent oxide material and silicon oxide.

According to other aspect of the invention, the interlayer insulating film is formed by using a siloxane-based material or formed by using acrylic.

The light-emitting device of the invention is not limited to the above-mentioned passive-matrix type and an active matrix type light-emitting device may be also applied.

Therefore, according to other aspect of the invention, a light-emitting device comprises an insulating film, a first electrode being in contact with the insulating film and formed on the insulating film, an electroluminescent layer formed over the first electrode, and a second electrode formed over the electroluminescent layer to overlap with the first electrode, wherein the insulating film comprises nitrogen and silicon and the first electrode comprises a conductive transparent oxide material and silicon oxide.

In addition, according to other aspect of the invention, a light-emitting device comprises a first electrode formed on an insulating surface, an electroluminescent layer formed over the first electrode, a second electrode formed over the electroluminescent layer to overlap with the first electrode, and an insulating film being in contact with the second electrode and formed to be in contact with the second electrode, wherein the insulating film comprises nitrogen and silicon and the second electrode comprises a conductive transparent oxide material and silicon oxide.

In the invention, a conductive transparent oxide material and silicon oxide are used for one electrode included in a light-emitting element, and an insulating film comprising at least silicon and nitrogen is formed so as to be in contact with the electrode. Accordingly, the extraction efficiency can be improved compared with the case of using the conventional light-emitting device, even when a light-emitting device of the invention has the same aperture ratio as that of the conventional light-emitting device. As a result, high external quantum efficiency can be obtained. Thus, it is possible to provide a light-emitting device in which high luminance can be obtained with low power consumption.

BRIEF DESCRIPTION OF THE DRAWINGS

FIGS. 9A and 9B show cross-sectional views of a pixel of a light-emitting device according to certain aspect of the invention;

FIGS. 10A to 10C show cross-sectional views of a pixel of a light-emitting device according to certain aspect of the invention;

DETAILED DESCRIPTION OF THE INVENTION

Embodiment Mode

Figure 1A:
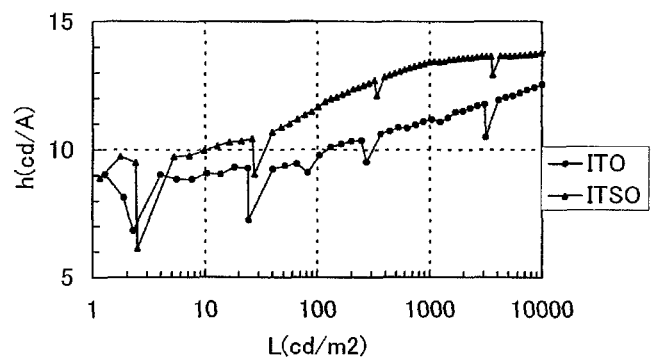
FIGS. 1A to 1C show a graph of a measured value of luminance and current efficiency.

Hereinafter, embodiment mode of the present invention is explained. Note that the same reference numerals denote the same parts among each drawing, and the explanation will not be repeated in the following explanations.

In FIG. 1A, silicon nitride oxide is used as an insulating film to show a measured value of current efficiency $\eta$ (cd/A), to luminance L (cd/m$^2$), of a light-emitting element in which an anode is formed by using ITO comprising silicon oxide of 5 wt. % (hereinafter referred to as ITSO) over the insulating film. In FIG. 1A, as a comparison, silicon nitride oxide is similarly used as an insulating film to show a measured value of current efficiency $\eta$ (cd/A), to luminance L (cd/m$^2$), of a light-emitting element in which an anode is formed by using ITO over the insulating film.

In a sample used for a measurement shown in FIG. 1A, an insulating film using silicon nitride oxide is formed over an insulating film of 0.8 μm thick which comprises a Si—O bond and a Si—CH$_X$ bonding hand formed by using a siloxane-based material as a start material. The insulating film using silicon nitride oxide is formed to have a film thickness of 100 nm with a CVD method, and the silicon:nitrogen:oxygen: hydrogen composition ratio (atomic %) is 32:34:14:20.

As shown in FIG. 1A, a sample using ITSO for the anode has higher current efficiency than a sample using ITO for the anode.

Figure 1B:
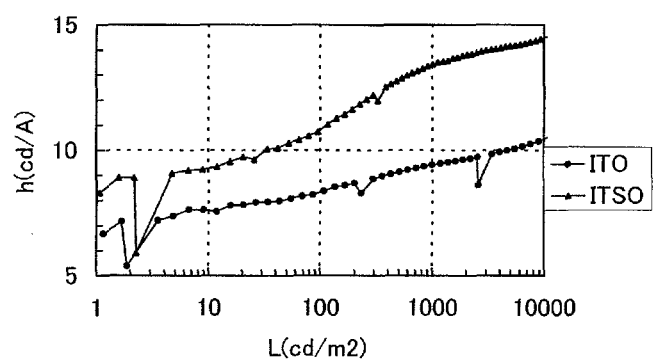

Next, in FIG. 1B, silicon nitride is used as an insulating film to show a measured value of current efficiency $\eta$ (cd/A), to luminance L (cd/m$^2$), of a light-emitting element in which an anode is formed by using ITSO that comprises silicon oxide of 5 wt. % over the insulating film. In FIG. 1B, as a comparison, silicon nitride is similarly used as an insulating film to show a measured value of current efficiency $\eta$ (cd/A), to luminance L (cd/m$^2$), of a light-emitting element in which an anode is formed by using ITO over the insulating film.

In a sample used for a measurement shown in FIG. 1B, an insulating film using silicon nitride is formed over an insulating film of 0.8 μm thick which comprises acrylic. The insulating film using silicon nitride is formed to have a film thickness of 100 nm with a sputtering method, and the silicon: nitrogen composition ratio is 42:58.

As shown in FIG. 1B, as well as FIG. 1A, a sample using ITSO for the anode has higher current efficiency than a sample using ITO for the anode.

Figure 1C:
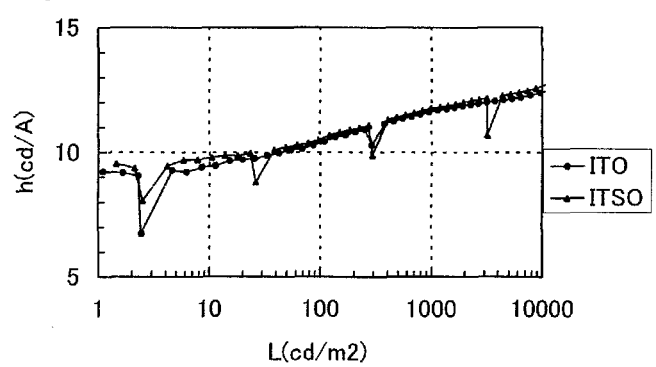

Next, in FIG. 1C, silicon oxide is used as an insulating film to show a measured value of current efficiency $\eta$ (cd/A), to luminance L (cd/m$^2$), of a light-emitting element in which an anode is formed by using ITSO comprising silicon oxide of 5 wt. % over the insulating film. In FIG. 1C, as a comparison, silicon oxide is used as an insulating film to show a measured value of current efficiency η (cd/A), to luminance L (cd/m$^2$), of a light-emitting element in which an anode is formed by using ITO over the insulating film.

In a sample used for a measurement shown in FIG. 1C, an insulating film using silicon oxide formed with a CVD method is formed to have a film thickness of 100 nm. The insulating film using the silicon oxide slightly comprises nitrogen for convenience of a manufacturing step, and the silicon:nitrogen:oxygen:hydrogen composition ratio is 30:3:60:7.

Comparing FIGS. 1A to 1C, a combination in which ITSO is used for an anode, and silicon nitride oxide or silicon nitride is used for an insulating film can obtain higher current efficiency compared with other combination. This is because the light extraction efficiency that is obtained through an insulating film is highest with the combination in which ITSO is used for an anode and silicon nitride oxide or silicon nitride is used for an insulating film. That is, although all the samples have the identical internal quantum efficiency by itself, the extraction efficiency is improved. It is conceivable that the external quantum efficiency is enhanced.

Then, in the invention, according to the finding obtained from the measurement result shown in FIGS. 1A to 1C, a conductive transparent oxide material and silicon oxide are used for one electrode included in a light-emitting element, and an insulating film comprising at least silicon and nitrogen is formed so as to be in contact with the electrode. A composition ratio of nitrogen in the insulating film is 10 atomic % or more, preferably 25 atomic % or more. When nitrogen and oxygen are included in the insulating film, a composition ratio of nitrogen is made higher than that of oxygen. In addition, silicon oxide included in the electrode ranges from 1 wt. % to 10 wt. %, preferably from 2 wt. % to 5 wt. %. According to the above-mentioned structure, the extraction efficiency can be improved compared with the case of using the conventional light-emitting device, even when a light-emitting device of the invention has the same aperture ratio as that of the conventional light-emitting device. As a result, high external quantum so efficiency can be obtained.

It is possible to use indium tin oxide (ITO), zinc oxide (ZnO), indium zinc oxide (IZO), zinc oxide added with gallium (GZO), or the like for a conductive transparent oxide material. The electrode can be formed with a sputtering method by using a target comprising the conductive transparent oxide material and silicon oxide.

Note that an electroluminescent layer includes a plurality of layers in the invention, and these layers can be classified into a hole injection layer, a hole transport layer, a light-emitting layer, an electron transport layer, an electron injection layer, and the like in terms of carrier transport properties. The distinction between a hole injection layer and a hole transport layer is not always accurate, and these layers are the same in respect that hole transport properties (hole mobility) are specifically important properties. For convenience, a hole injection layer is a layer on the side being in contact with an anode, and a layer on the side being in contact with the hole injection layer is referred to as a hole transport layer to distinguish them. It is the same for the electron transport layer and the electron injection layer, and a layer being in contact with a cathode is referred to as an electron injection layer and a layer being in contact with the electron injection layer is referred to as an electron transport layer. When the light-emitting layer also serves as an electron transport layer, it is referred to as a light-emitting electron transport layer.

In addition, a complex material of an organic material and an inorganic material, a material added with a metal complex into an organic compound, and the like can be substituted for an organic material of the electroluminescent layer as long as it has the same properties.

Figure 2A:
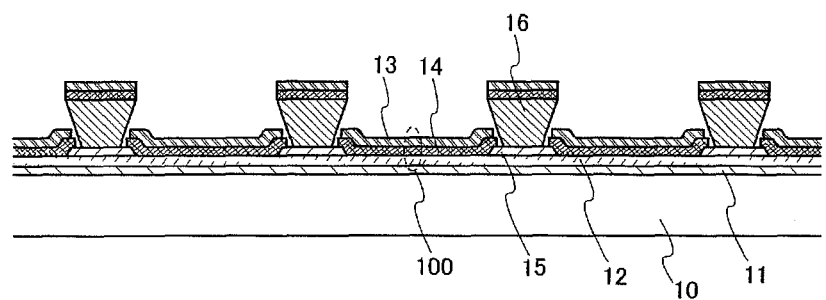
FIGS. 2A and 2B show a plan view of a light-emitting device and a cross-sectional view of a pixel according to certain aspect of the invention.
Figure 2B:
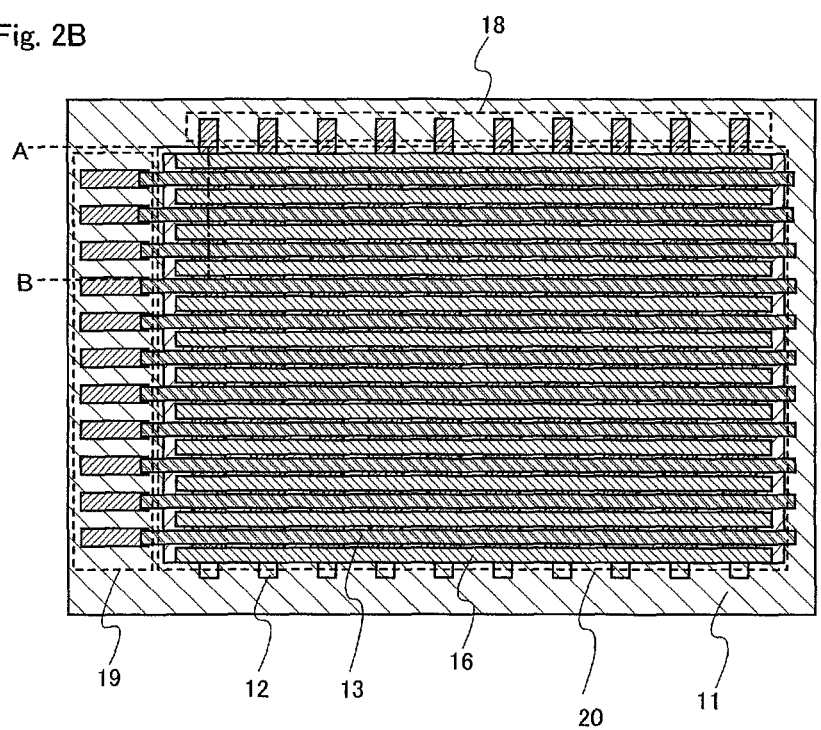

FIG. 2A is a cross-sectional view showing one mode of a light-emitting device of the invention, and FIG. 2B is a plan view of a light-emitting device shown in FIG. 2A.

A cross-sectional view taken along A-B in FIG. 2B corresponds to FIG. 2A. In the light-emitting devices shown in FIGS. 2A and 2B, an insulating film (hereinafter, intentionally referred to as a transmitting film 11 to distinguish from other insulating films) is formed over a substrate 10. Then, a pixel portion 20 in which light-emitting elements are arranged in a matrix and input terminal portions 18 and 19 are formed on the transmitting film 11. Each light-emitting element 100 includes a first electrode 12 extending in one direction, a second electrode 13 extending in a direction intersecting with it, and an electroluminescent layer 14 formed between the first electrode 12 and the second electrode 13. A plurality of the first electrodes 12 is formed in parallel and a plurality of the second electrodes 13 is formed in parallel.

The transmitting film 11 is an insulating film comprising nitrogen and silicon such as silicon nitride, silicon nitride oxide, or the like. The transmitting film 11 has a composition ratio of nitrogen of 10 atomic % or more, more preferably 25 atomic % or more, and can be formed by using, for example, a sputtering method or a CVD method. When nitrogen and oxygen are included in the transmitting film 11, a composition ratio of nitrogen is made higher than that of oxygen. In addition, the first electrode 12 included in the light-emitting element comprises a conductive transparent oxide material and silicon oxide. Specifically, the first electrode 12 comprises silicon oxide of from 1 wt. % to 10 wt. %. In this embodiment mode, ITO is used for the conductive transparent oxide material and ITSO comprising ITO and silicon oxide is used for the first electrode 12. The conductive transparent oxide material is not limited to ITO and, for example, zinc oxide (ZnO), indium zinc oxide (IZO), zinc oxide added with gallium (GZO), or the like can be used. The first electrode 12 is formed to be in contact with the transmitting film 11. The first electrode 12 can be formed by a sputtering method. Of course, it may be formed by carrying out co-evaporation with a vacuum vapor deposition method as long as the same composition can be obtained.

Note that the substrate 10 and the transmitting film 11 are being in contact with each other in FIGS. 2A and 2B; however, the invention is not limited to this structure. Another insulating film may be formed between the substrate 10 and the transmitting film 11.

The light-emitting element 100 adjacent to each other are electrically isolated by a first bank 15 and a second bank 16 formed on the first bank 15 both of which are formed from an insulating film. The first bank 15 has an effect not to make the first electrode 12 and the second electrode 13 short-circuited on the edge of the electroluminescent layer 14. In FIG. 2A, the shape of the second bank 16 has a so-called reverse tapered shape, in which the outer of the top part projects outward compared with the bottom.

One of the first electrode 12 and the second electrode 13 corresponds to an anode, and the other one to a cathode. In FIGS. 2A and 2B, the case where the first electrode 12 is an anode and the second electrode 13 is a cathode is explained as an example; however, the first electrode 12 may be a cathode and the second electrode 13 may be an anode. The electroluminescent layer 14 can be classified into a hole transport layer, a light-emitting layer, and an electron transport layer sequentially from the anode side in terms of carrier transport properties. In addition, a hole injection layer may be provided between the anode and the hole transport layer, and a electron injection layer may be provided between the cathode and the electron transport layer. The distinction between the hole injection layer and the hole transport layer, and the distinction between the electron injection layer and the electron transport layer are not always accurate, and these layers are the same in respect that hole transport properties (hole mobility) and electron transport properties (electron mobility) are specifically important properties. In addition, a structure in which a hole block layer is provided between the electron transport layer and the light-emitting layer may be applied. The light-emitting layer may have a different light-emitting color by adding a guest material such as pigment or a metal complex into a host material. That is, a light-emitting layer may be formed by adding a fluorescent material or a phosphorescent material.

In FIGS. 2A and 2B, a conductive transparent oxide material and silicon oxide are used for the first electrode much nearer the substrate side between the first electrode and the second electrode, and it is formed so that the first electrode and the transmitting film is being in contact with each other. However, the invention is not limited to this structure. After forming the second electrode by using, for example, a conductive transparent oxide material and silicon oxide, the transmitting film may be formed to be in contact with the second electrode.

Next, a method for manufacturing the light-emitting device shown in FIGS. 2A and 2B are explained with reference to FIGS. 3A and 3B, FIGS. 4A and 4B, and FIG. 5. First, the transmitting film 11 is formed on the main surface of the substrate 10. The composition and manufacturing method of the transmitting film 11 are as mentioned above. A glass substrate such as a barium borosilicate glass or an alumino borosilicate glass, a quartz substrate, or the like can be used for the substrate 10. In FIGS. 2A and 2B, the light-emitting element extracting light from the first electrode 12 is used; therefore, the substrate 10 is has transmittance. However, when light is extracted from the second electrode 13, a metal substrate including a stainless steel substrate, a silicon substrate on which an insulating film is formed, a ceramic substrate, or the like may be used in addition to the above-mentioned substrate. Though generally tending to have lower heat resistant temperature than that of the above-mentioned substrates, a substrate made from a synthetic resin having flexibility such as plastic can be used as long as it can withstand a processing temperature in a manufacturing step.

Figure 3A:
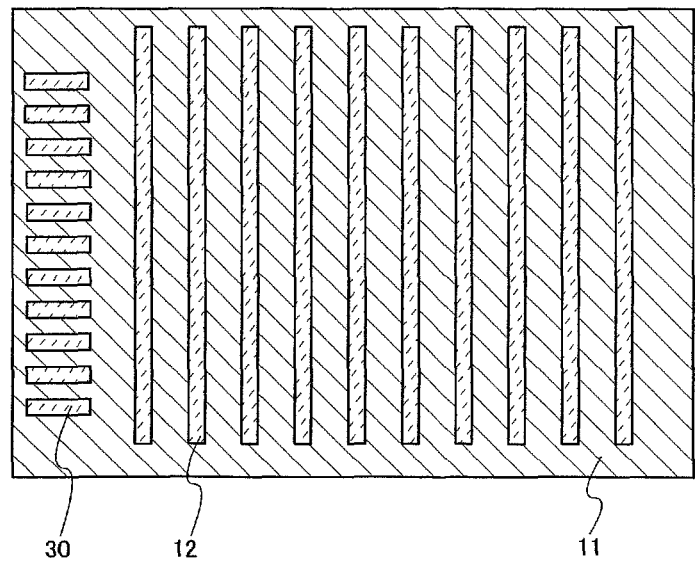
FIGS. 3A and 3B show plan views of a manufacturing step of a light-emitting device according to certain aspect of the invention.

Next, as shown in FIG. 3A, a terminal 30 for forming a first electrode 12 extending in one direction and an input terminal portion is formed from the same material on the transmitting film 11. The composition and the manufacturing method of the first electrode 12 are as mentioned above.

Figure 3B:
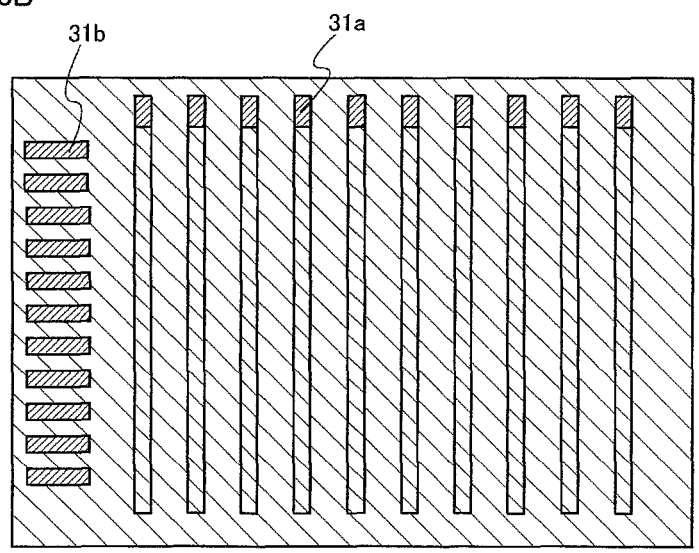

Next, as shown in FIG. 3B, auxiliary electrodes 31a and 31b are formed in an input terminal portion formation region of the first electrode 12 and a connection portion and input terminal portion formation region of the second electrode 13. It is preferable to form the auxiliary electrodes from a conductive material having excellent heat seal properties when they are connected with an external circuit and they may be formed from a metal material such as chromium or nickel.

Figure 4A:
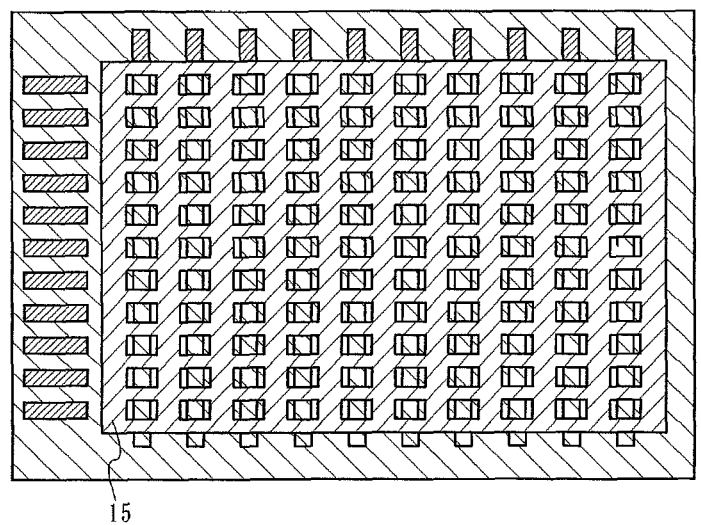
FIGS. 4A and 4B show plan views of a manufacturing step of a light-emitting device according to certain aspect of the invention.

Next, as shown in FIG. 4A, a first bank 15 is formed. This first bank 15 has an opening in a region overlapping with the first electrode 12. This first bank 15 can be formed from silicon oxide, silicon nitride, silicon oxynitride, aluminum oxide, aluminum nitride, aluminum oxynitride, other inorganic materials having insulation; acrylic acid, methacrylic acid, and a derivative thereof; a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or organic siloxane material in which hydrogen over silicon is substituted by an organic group such as methyl or phenyl.

When silicon oxide is used for the first bank 15 for example, the opening of the first bank 15 can be formed by using an etching gas such as $C_4F_8$ or $CHF_3$. In addition, when, for example, silicon nitride is used, it can be formed by using an so etching gas such as HBr or $Cl_2$.

Figure 4B:
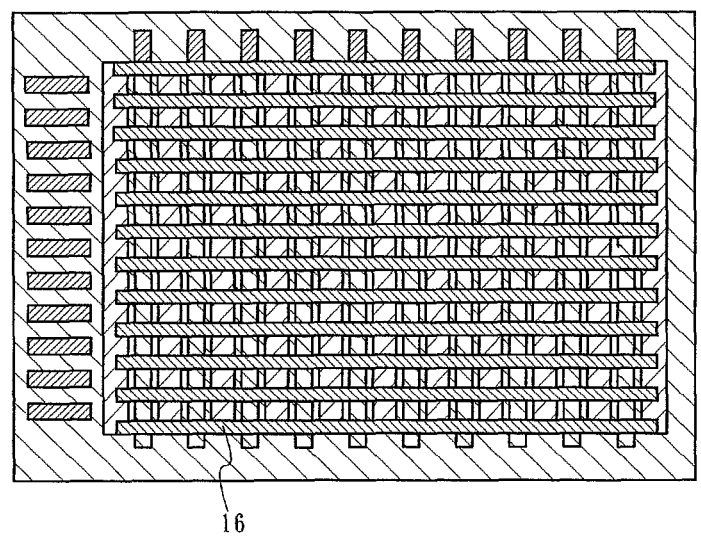

Next, a second bank 16 is formed as shown in FIG. 4B to isolate the electroluminescent layer 14 formed in a later step and the second electrode 13 between the light-emitting elements adjacent to each other. As shown in FIG. 4B, the shape of this second bank 16 may be a so-called reverse tapered shape, in which a dimension in a width direction at the top part is longer than that at the bottom part, a forward tapered shape, in which a dimension in a width direction at the bottom part is longer than that at the top part, or a T-shape. In either case, the second bank 16 is formed to extend in a direction intersecting with the first electrode 12 so that a part of the first electrode 12 is exposed and to be disposed with a predetermined space.

The second bank 16 is formed from acrylic acid, methacrylic acid, and the derivative thereof; a photosensitive organic resin material including polyimide, aromatic polyamide, polybenzimidazole, or other high molecular weight materials; inorganic siloxane including a Si—O—Si bond among the compound made from silicon, oxygen, and hydrogen, formed by using a siloxane-based material as a start material; or organic siloxane material in which hydrogen over silicon is substituted by an organic group such as methyl or phenyl.

Figure 5:
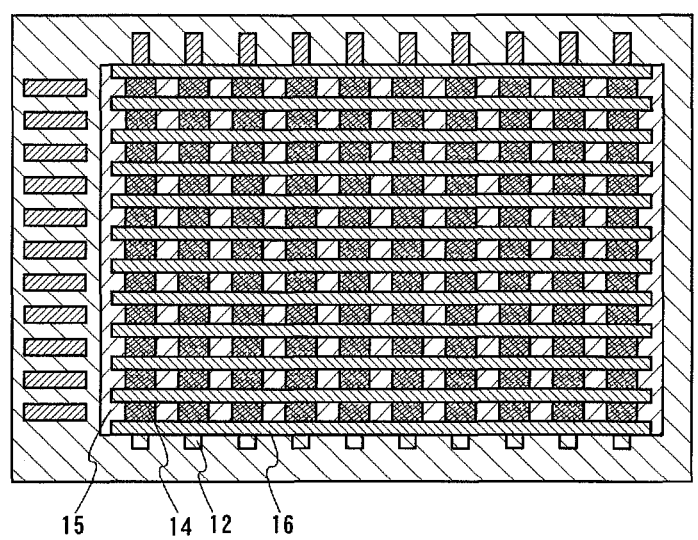
FIG. 5 shows a plan view of a manufacturing step of a light-emitting device according to certain aspect of the invention.

Thereafter, as shown in FIG. 5, an electroluminescent layer 14 is formed over a first electrode 12 exposed from an opening of a first bank 15. The electroluminescent layer 14 has a single layer structure of a light-emitting layer or a laminated structure of a plurality of layers including a light-emitting layer. For example, CuPc, MoOx (x=from 2 to 3), or PEDOT/PSS is formed as a hole injection layer, α-NPD is formed as a hole transport layer, $Alq_3$:DMQd (DMQd: quinacridone derivative) is formed as a light-emitting layer, and $Alq_3$ is formed as an electron transport layer.

In addition, before forming the electroluminescent layer 14, oxygen plasma treatment or ultraviolet ray irradiation treatment may be carried out on the first electrode 12 exposed in the opening of the first bank 15, so that a work function of the first electrode 12 may be increased. Moreover, before forming the electroluminescent layer 14, temperature of the substrate may be set to range from 200° C. to 450° C., preferably from 250° C. to 300° C. under an air atmosphere or a vacuum atmosphere (preferably, approximately from $10^{-4}$ Pa to $10^{-8}$ Pa) to carry out heat treatment on the first electrode 12 in order to increase reliability of a light-emitting element. Furthermore, wiping and cleaning treatment or polishing treatment may be carried out to improve planarity by cleaning.

Next, as shown in FIG. 2B, the second electrode 13 extending in a direction intersecting with the first electrode 12 is formed in a region where the electroluminescent layer 14 is formed over the first electrode 12. When the second electrode 13 is a cathode, it is formed from a conductive material including an alkali metal or an alkaline earth metal. Metal, alloy, an electrical conductive compound, a compound thereof, and the like having a low work function is used for a cathode to inject an electron efficiently into the electroluminescent layer 14. Specifically, a cathode may be also formed by using a rare-earth metal such as Yb or Er in addition to an alkali metal such as Li or Cs, an alkaline earth metal such as Mg, Ca, or Sr, and an alloy comprising them (Mg:Ag, Al:Li, or the like). In addition, a layer comprising a material with high hole injection properties is formed to be in contact with the cathode. Therefore, titanium, tantalum, molybdenum, chromium, nickel, aluminum, or a metal comprising aluminum as the main component; a conductive material comprising the metal and nitrogen of which concentration is a stoichiometric composition ratio or less; or an ordinary conductive film using a conductive transparent oxide material or the like can be also used.

The region where the electroluminescent layer 14 is thus sandwiched between the first electrode 12 and the second electrode 13 corresponds to the light-emitting element 100. In addition, the second electrode 13 is extended to the region where the electrode 31b of the input terminal part 19 is formed.

Figure 6:
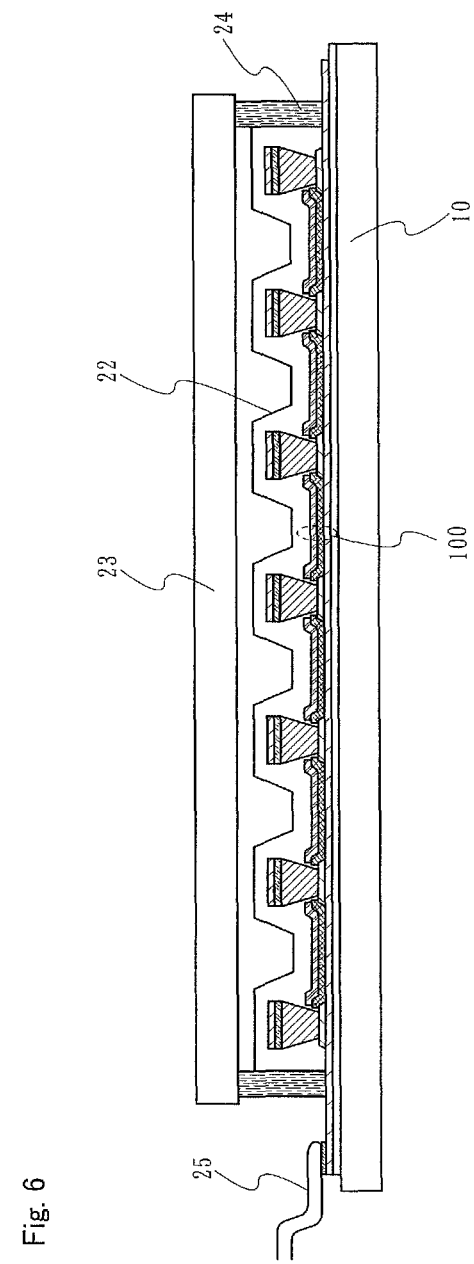
FIG. 6 shows a cross-sectional view of a light-emitting device according to certain aspect of the invention.
Figure 7:
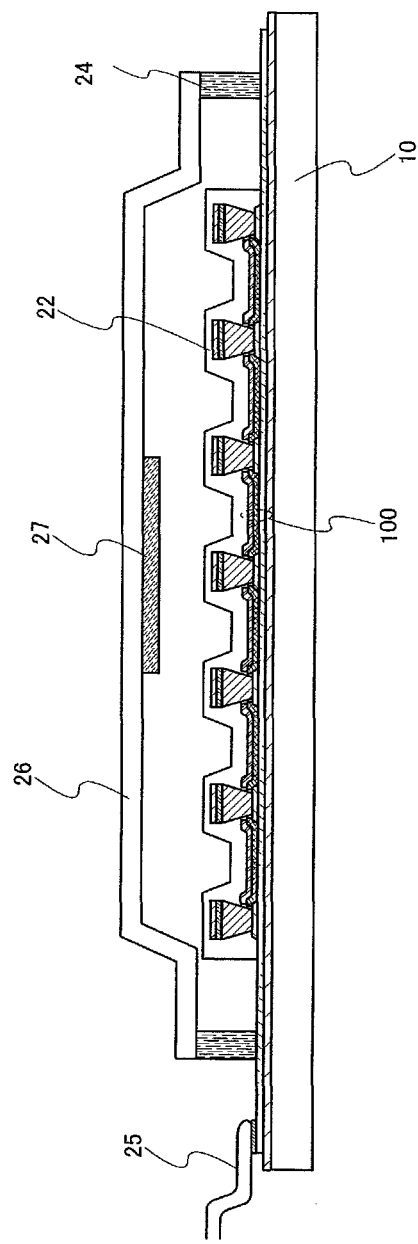
FIG. 7 shows a cross-sectional view of a light-emitting device according to certain aspect of the invention.

As mentioned above, a panel having the pixel portion 20 where the light-emitting element is formed is formed. Thereafter, as shown in FIG. 6, a protective film 22 preventing invasion of water or the like is formed, and a sealing substrate 23 made from a ceramic material such as glass, quartz, or alumina or a synthetic material is fixed with an adhesive agent 24 for sealing. In addition, an external input terminal portion is connected by using a flexible printed-wiring board 25 when it is connected with the external circuit. As shown in FIG. 7, a sealing can 26 is used for a sealing structure and it may be fixed with the adhesive agent 24 for sealing after providing a drying agent 27 in the can. The protective film 22 may be formed from a lamination of carbon nitride and silicon nitride to have a structure enhancing gas barrier properties with decreasing a stress as well as it is formed from silicon nitride.

Figure 8A:
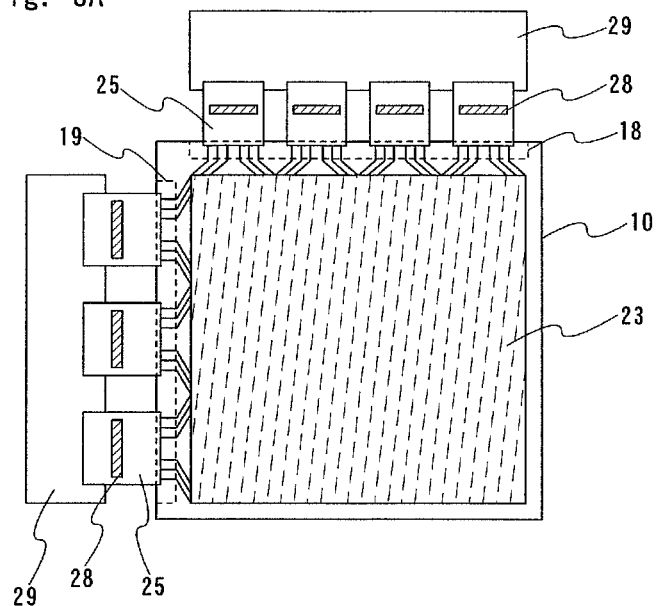
FIGS. 8A and 8B show plan views of modules in which an external circuit is connected to a panel where a pixel portion is formed.
Figure 8B:
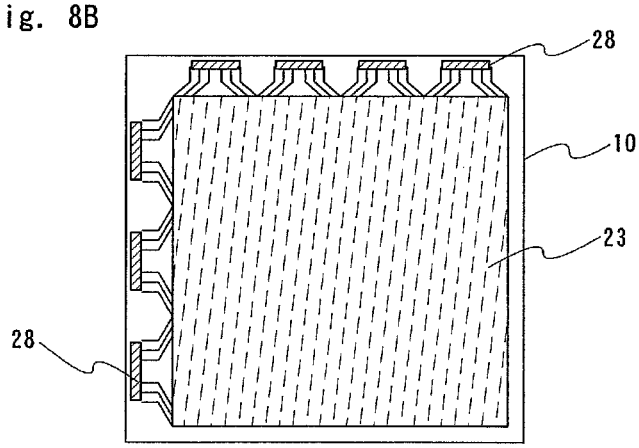

FIGS. 8A and 8B shows an appearance of a module in which an external circuit is connected to a panel shown in FIG. 6. In FIG. 8A, a flexible printed-wiring board 25 is fixed with external input terminal portions 18 and 19, and it is electrically connected with an external circuit substrate 29 in which a power supply circuit or a signal processing circuit is formed. In addition, a mounting method of a driver IC 28, which is one of the external circuits, may be either a COG method or a TAB method, and the case of applying a TAB method is shown in FIG. 8A. FIG. 8B shows an appearance that a driver IC 28, which is one of the external circuits, is mounted by using a COG method.

Note that the panel and the module correspond to one mode of the light-emitting device of the invention, and both of them are included in a category of the invention.

Embodiment 1

A structure of a light-emitting device of the present invention, which differs from a light-emitting device shown in FIG. 2A, is explained in this embodiment.

A mode of providing a base film 40 formed from an insulating film between a substrate 10 and a transmitting film 11 in a light-emitting device shown in FIG. 2A is explained with reference to FIG. 9A. The base film 40 is formed by using an insulating film comprising a Si—O bond and a Si—CH$_X$ bonding hand formed by using a siloxane-based material as a start material, or by using acrylic. The surface of the base film 40 can be flattened by providing the base film 40 even when there is a projection on the surface of the substrate 10. Thus, even when there is a projection on the surface of the substrate 10, unevenness or a point defect in a display of a light-emitting element to be formed later can be prevented.

Next, a mode of extracting light from a second electrode 13 included in a light-emitting element 100 in the light-emitting device shown in FIG. 2A is explained with reference to FIG. 9B. As shown in FIG. 9B, when light is extracted from a second electrode 13, a transmitting film does not have to be formed between a first electrode 12 and a substrate 10. Alternatively, a transmitting film 41 is formed to be in contact with the second electrode 13. Then, a conductive transparent oxide material and silicon oxide are used for the second electrode 13 to be light-transmitting.

Note that a dual emission light-emitting device can be formed by making light to be extracted from the both the first electrode 12 and the second electrode 13. In this case, both a transmitting film being in contact with the first electrode 12 and a transmitting film being in contact with the second electrode 13 are provided.

Next, a mode in which a second bank 16 is made to be a forward tapered shape, in which a dimension in a width direction at the bottom part is longer than that at the top part, in the light-emitting device shown in FIG. 2A is explained with reference to FIG. 10A. In FIG. 10A, light-emitting elements 100 adjacent to each other are isolated by a bank 42 having a forward tapered shape. In this case, an electroluminescent layer 14 is formed along the tilted side of the bank 42, and a stress applied to the electroluminescent layer can be relieved by making a tilt angle of the bank 42 from 30° to 65°. Only one bank is provided in FIG. 10A; however, two banks may be provided just like in FIG. 2A.

FIG. 10A shows a mode in which light from the light-emitting element 100 is extracted from the first electrode 12; however, it may be made to be extracted from a second electrode 13 as shown in FIG. 10B. In FIG. 10B, a light-transmitting film 43 may be provided so that it is in contact with the second electrode 13. In addition, as shown in FIG. 10C, light from a light-emitting element 100 may be made to be extracted from both a first electrode 12 and a second electrode 13. In FIG. 10C, a light-transmitting film 44 is provided so that it is in contact with the first electrode 12, and a light-transmitting film 45 is formed so that it is in contact with the second electrode 13.

Embodiment 2

Specific structure of a light-emitting element is explained in this embodiment.

Figure 11A:
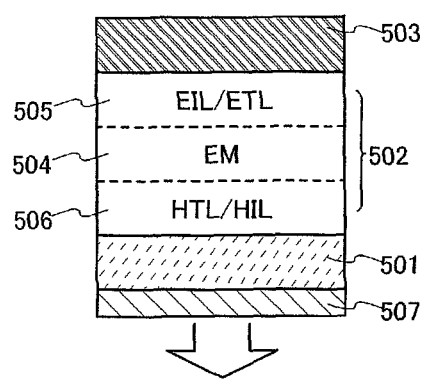
FIGS. 11A to 11D show configuration diagrams of a light-emitting element of a light-emitting device according to certain aspect of the invention.

FIG. 11A shows an example of forming a first electrode 501 from a conductive transparent oxide material, and light is extracted from the first electrode 501. An electroluminescent layer 502 and a second electrode 503 are sequentially laminated over the first electrode 501. A hole injection layer or hole transport layer 506, a light-emitting layer 504, and an electron transport layer or electron injection layer 505 are laminated in the electroluminescent layer 502 from the side nearest to the first electrode 501. The second electrode 503 is formed from a material that can shield light among metal, alloy, an electrical conductive compound, a compound thereof, and the like having a low work function. In the case of FIG. 11A, a light-transmitting film 507 is formed to be in contact with the first electrode 501.

Figure 11B:
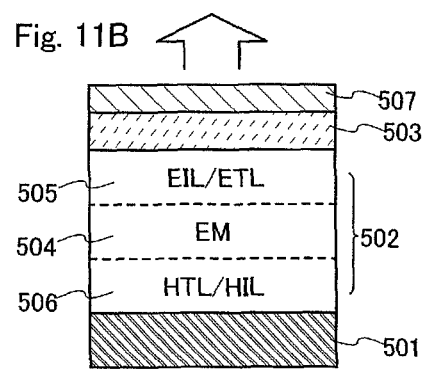

FIG. 11B shows an example of extracting light from a second electrode 503, and light can be shielded by the first electrode 501, which is formed from a material having a work function high enough to be used for an anode. Specifically, in addition to a single-layered film made from one or a plurality of, for example, TiN, ZrN, Ti, W, Ni, Pt, Cr, Ag, and the like, lamination of a film comprising titanium nitride and a film comprising aluminum as the main component; a triple-layered structure of a titanium nitride film, a film comprising aluminum as the main component, and a titanium nitride film; or the like can be used. Then, an electroluminescent layer 502 in which a hole injection layer or hole transport layer 506, a light-emitting layer 504, and an electron transport layer or electron injection layer 505 are laminated is provided over the first electrode 501. A conductive transparent oxide material and silicon oxide are used for the second electrode 503. In the case of FIG. 11B, a light-transmitting film 507 is formed to be in contact with the second electrode 503.

Figure 11C:
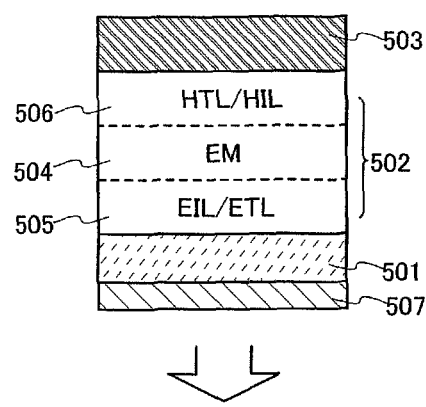

FIG. 11C shows the case where light can be extracted from a first electrode 501 and where the first electrode 501 is a cathode and a second electrode 503 is an anode. In FIG. 11C, an electron transport layer or electron injection layer 505, a light-emitting layer 504, and a hole injection layer or hole transport layer 506 are sequentially laminated in an electroluminescent layer 502 from the side nearest to the first electrode 501. A conductive transparent oxide material and silicon oxide are used for the first electrode 501. The second electrode 503 can be formed by using the same material as the first electrode 501 of FIG. 11B. In the case of FIG. 11C, a light-transmitting film 507 is formed to be in contact with the first electrode 501.

Figure 11D:
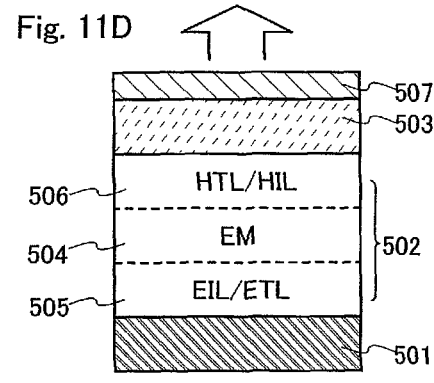

FIG. 11D shows an example of extracting light from a second electrode 503 and shows the case where a first electrode 501 is a cathode and a second electrode 503 is an anode. In FIG. 11D, an electron transport layer or electron injection layer 505, a light-emitting layer 504, a hole injection layer or hole transport layer 506 are sequentially laminated in an electroluminescent layer 502 from the side nearest to the first electrode 501. The first electrode 501 can be formed by using the same material as the second electrode 503 of FIG. 11A. A conductive transparent oxide material and silicon oxide are used for the second electrode 503. In the case of FIG. 11D, a light-transmitting film 507 is formed to be in contact with the second electrode 503.

Note that FIGS. 11A to 11D show examples of extracting light from either of the first electrode 501 or the second electrode 503; however, the present invention is not limited to this structure. When the first electrode 501 is an anode and the second electrode 503 is a cathode, light can be obtained from both the first electrode 501 and the second electrode 503 by combining a light-emitting element shown in FIG. 11A with the second electrode 503 shown in FIG. 11B. When the first electrode 501 is a cathode and the second electrode 503 is an anode, light can be obtained from both the first electrode 501 and the second electrode 503 by combining a light-emitting element shown in FIG. 11C with the second electrode 503 shown in FIG. 11D. In this case, the light-transmitting film being in contact with the first electrode 501 and the light-transmitting film being in contact with the second electrode 503 are provided.

Embodiment 3

Figure 12A:
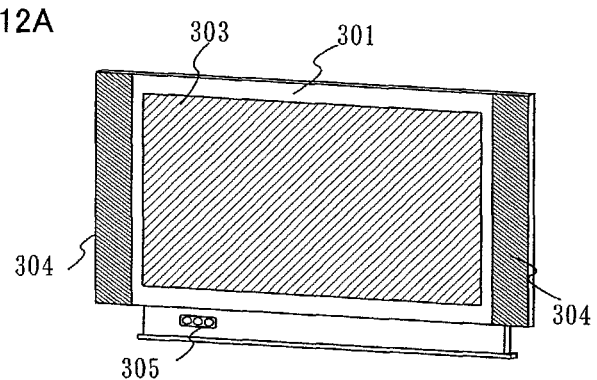
FIGS. 12A and 12B show electronic devices using a light-emitting device according to certain aspect of the invention.
Figure 12B:
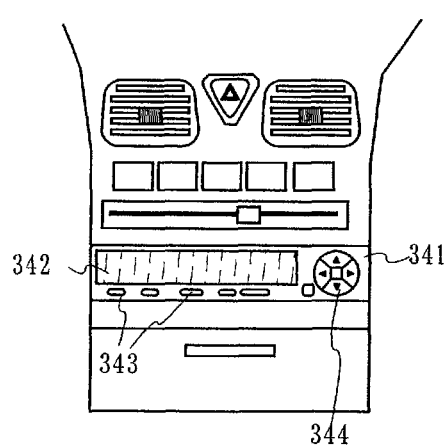

FIGS. 12A and 12B show a use mode of a light-emitting device according to the present invention. FIG. 12A is a mode completed as a TV receiver, and a display screen 303 is formed by a module shown in FIGS. 11A to 11D. That is, the module shown in FIGS. 11A to 11D is placed in a casing 301, and a speaker 304, an operation switch 305, and the like are provided as other attached equipments. In addition, FIG. 12B is a mode completed as an audio equipment mountable on an automobile or the like, and a display screen 342 displaying an operating state or the like of this equipment is formed by the module as shown in FIGS. 11A to 11D. That is, the module shown in FIGS. 11A to 11D is placed in a casing 341, and operation switches 343 and 344, and the like are provided as other attached equipments.

Embodiment 4

In an active matrix type light-emitting device of this embodiment, a light-emitting element, a transistor for controlling input of a video signal into a pixel (a switching transistor), and a transistor for controlling a current value supplied to the light-emitting element (a drive transistor) are provided in each pixel.

Figure 13:
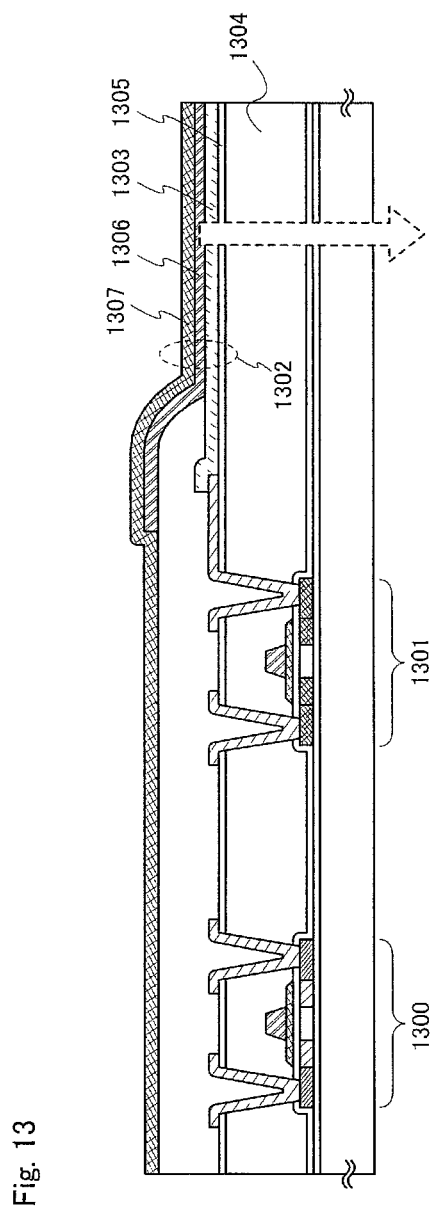
FIG. 13 shows a cross-sectional view of a pixel of a light-emitting device according to certain aspect of the invention.

FIG. 13 shows a cross-sectional view of a pixel portion of an active matrix type light-emitting device when a switching transistor 1300 is an n-channel type, a drive transistor 1301 is a p-channel type, and light emitted from a light-emitting element 1302 is extracted from the side of a first electrode 1303. The switching transistor 1300 and the drive transistor 1301 are a top gate type.

The switching transistor 1300 and the drive transistor 1301 are covered with an interlayer insulating film 1304. A light-transmitting film 1305 is formed on the interlayer insulating film 1304, and the light-emitting element 1302 is formed over the light-transmitting film 1305. The first electrode 1303, an electroluminescent layer 1306, and a second electrode 1307 are sequentially laminated in the light-emitting element 1302.

The interlayer insulating film 1304 can be formed by using an organic resin film, an inorganic insulating film, or an insulating film including Si—O—Si bond formed by using a siloxane-based material as a start material (hereinafter, referred to as a siloxane-based insulating film). In the siloxane-based insulating film, at least one kind of fluorine, alkyl, or aromatic hydrocarbon may be included in the substituent in addition to hydrogen. A material referred to as a low dielectric constant material (low-k material) may be used for the interlayer insulating film 1304.

The light-transmitting film 1305 is an insulating film comprising nitrogen and silicon, for example, silicon nitride, silicon nitride oxide, or the like. The light-transmitting film 1305, of which composition ratio of nitrogen is 10 atomic % or more, more preferably 25 atomic % or more, can be formed by using a sputtering method or a CVD method. When nitrogen and oxygen are included in the light-transmitting film 1305, a composition ratio of nitrogen is made to be higher than that of oxygen.

A conductive transparent oxide material and silicon oxide are used for the first electrode 1303. Indium tin oxide (ITO), zinc oxide (ZnO), indium zinc oxide (IZO), zinc oxide added with gallium (GZO), or the like can be used for the conductive transparent oxide material.

In addition, the second electrode 1307 is formed from a material that reflects or shields light and is formed to have such a film thickness that reflects or shields light, and can be formed from metal, alloy, an electrical conductive compound, a compound thereof, and the like having a low work function. Specifically, a rare-earth metal such as Yb or Er can be used in addition to an alkali metal such as Li or Cs, an alkaline earth metal such as Mg, Ca, or Sr, an alloy comprising them (Mg:Ag, Al:Li, Mg:In, or the like), and a compound thereof ($CaF_2$ or CaN). In addition, other conductive layers such as Al can be used when an electron injection layer is provided.

The electroluminescent layer 1306 includes a single layer or a plurality of layers. When it includes a plurality of layers, these layers can be classified into a hole injection layer, a hole transport layer, a light-emitting layer, an electron transport layer, an electron injection layer, and the like in terms of carrier transport properties. When the electroluminescent layer 1306 includes any one of a hole injection layer, a hole transport layer, an electron transport layer, and an electron injection layer besides a light-emitting layer, a hole injection layer, a hole transport layer, a light-emitting layer, an electron transport layer, and an electron injection layer are sequentially laminated over the first electrode 1303. The border of each layer is not always definite, and sometimes a material including each layer is partly mixed; therefore, the interface is unclear. An organic-based material and an inorganic-based material can be used for each layer. Any one of high molecular weight, middle molecular weight, and low molecular weight materials can be used as the organic-based material. The middle molecular weight material corresponds to a low polymer of which number of repetitions of a structure unit (a polymerization degree) ranges approximately from 2 to 20. The distinction between a hole injection layer and a hole transport layer is not always accurate, and these layers are the same in respect that hole transport properties (hole mobility) are specifically important properties.

In the case of a pixel shown in FIG. 13, light emitted from the light-emitting element 1302 can be extracted from the side of the first electrode 1303 as shown in a doted outline arrow.

According to the above-mentioned structure, the extraction efficiency can be improved compared with the case of using the conventional light-emitting device, even when a light-emitting device of the present invention has the same aperture ratio as that of the conventional light-emitting device. As a result, high external quantum efficiency can be obtained.

This embodiment shows an example that the switching transistor 1300 is an n-channel type; however, the switching transistor 1300 may be a p-channel type. In addition, this embodiment shows an example that the drive transistor 1301 is a p-channel type; however, the drive transistor 1301 may be an n-channel type.

Embodiment 5

Figure 14:
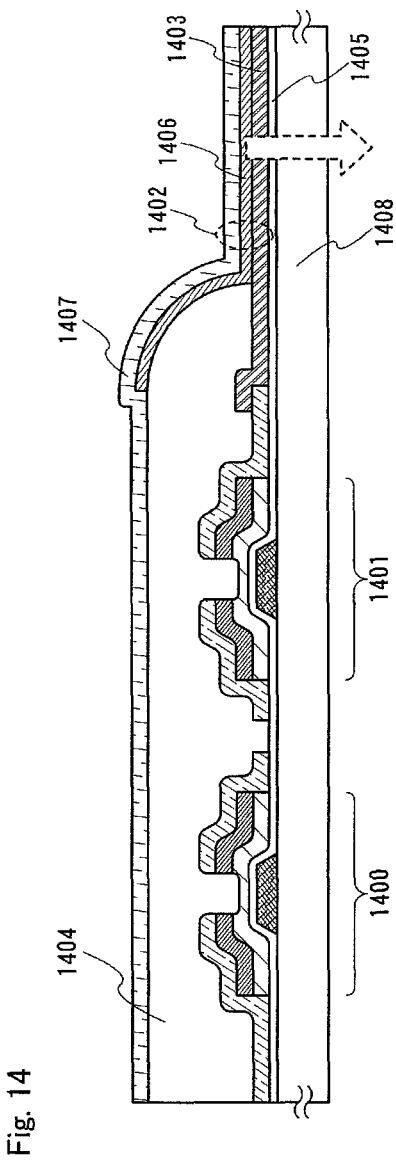
FIG. 14 shows a cross-sectional view of a pixel of a light-emitting device according to certain aspect of the invention.

FIG. 14 shows a cross-sectional view of a pixel portion of an active matrix type light-emitting device when a switching transistor 1400 is an n-channel type, a drive transistor 1401 is a p-channel type, and light emitted from a light-emitting element 1402 is extracted from the side of a first electrode 1403. The switching transistor 1400 and the drive transistor 1401 are a reverse stagger type (a bottom gate type).

The switching transistor 1400 and the drive transistor 1401 are covered with an interlayer insulating film 1404. A light-transmitting film 1405 is formed over a substrate 1408, and the light-emitting element 1402 is formed over the light-transmitting film 1405. The first electrode 1403, an electroluminescent layer 1406, and a second electrode 1407 are sequentially laminated in the light-emitting element 1402.

The interlayer insulating film 1404 can be formed by using an organic resin film, an inorganic insulating film, or an insulating film including Si—O—Si bond formed by using a siloxane-based material as a start material (hereinafter, referred to as a siloxane-based insulating film). In the siloxane-based insulating film, at least one kind of fluorine, alkyl, or aromatic hydrocarbon may be included in the substituent in addition to hydrogen. A material referred to as a low dielectric constant material (low-k material) may be used for the interlayer insulating film 1404.

The light-transmitting film 1405 is an insulating film comprising nitrogen and silicon, for example, silicon nitride, silicon nitride oxide, or the like. The light-transmitting film 1405, of which composition ratio of nitrogen is 10 atomic % or more, more preferably 25 atomic % or more, can be formed by using a sputtering method or a CVD method. When nitrogen and oxygen are included in the light-transmitting film 1405, a composition ratio of nitrogen is made to be higher than that of oxygen. Different from a top gate type, the light-transmitting film and the gate insulating film can be formed in the same step since the light-transmitting film 1405 also functions as a gate insulating film.

A conductive transparent oxide material and silicon oxide are used for the first electrode 1403. Indium tin oxide (ITO), zinc oxide (ZnO), indium zinc oxide (IZO), zinc oxide added with gallium (GZO), or the like can be used for the conductive transparent oxide material.

In addition, the second electrode 1407 is formed from a material that reflects or shields light and is formed to have such a film thickness that reflects or shields light, and can be formed from metal, alloy, an electrical conductive compound, a compound thereof and the like having a low work function. Specifically, a rare-earth metal such as Yb or Er can be used in addition to an alkali metal such as Li or Cs, an alkaline earth metal such as Mg, Ca, or Sr, an alloy comprising them (Mg:Ag, Al:Li, Mg:In, or the like), and a compound thereof ($CaF_2$ or CaN). Moreover, other conductive layers such as Al can be used when an electron injection layer is provided.

The electroluminescent layer 1406 includes a single layer or a plurality of layers. When it includes a plurality of layers, these layers can be classified into a hole injection layer, a hole transport layer, a light-emitting layer, an electron transport layer, an electron injection layer, and the like in terms of carrier transport properties. When the electroluminescent layer 1406 includes any one of a hole injection layer, a hole transport layer, an electron transport layer, and an electron injection layer besides a light-emitting layer, a hole injection layer, a hole transport layer, a light-emitting layer, an electron transport layer, and an electron injection layer are sequentially laminated over the first electrode 1403. The border of each layer is not always definite, and sometimes a material including each layer is partly mixed; therefore, the interface is unclear. An organic-based material and an inorganic-based material can be used for each layer. Any one of high molecular weight, middle molecular weight, and low molecular weight materials can be used as the organic-based material. The middle molecular weight material corresponds to a low polymer of which number of repetitions of a structure unit (a polymerization degree) ranges approximately from 2 to 20. The distinction between a hole injection layer and a hole transport layer is not always accurate, and these layers are the same in respect that hole transport properties (hole mobility) are specifically important properties.

In the case of a pixel shown in FIG. 14, light emitted from the light-emitting element 1402 can be extracted from the side of the first electrode 1403 as shown in a dotted outline arrow.

According to the above-mentioned structure, the extraction efficiency can be improved compared with the case of using the conventional light-emitting device, even when a light-emitting device of the present invention has the same aperture ratio as that of the conventional light-emitting device. As a result, high external quantum efficiency can be obtained.

This embodiment shows an example that the switching transistor 1400 is an n-channel type; however, the switching transistor 1400 may be a p-channel type. In addition, this embodiment shows an example that the drive transistor 1401 is a p-channel type; however, the drive transistor 1401 may be an n-channel type.

Embodiment 6

This embodiment shows an example of a specific element structure in Embodiment 2.

In FIG. 11A, a first electrode 501 made from a conductive transparent oxide material and silicon oxide, an electroluminescent layer 502, and a second electrode 503 which is a cathode are sequentially laminated over the light-transmitting film 507.

An insulating film comprising nitrogen and silicon, for example, silicon nitride and silicon nitride oxide is used for the light-transmitting film 507, and ITSO is used for the first electrode 501. In addition, CuPc (copper phthalocyanine) formed as a hole injection layer, α-NPD formed as a hole transport layer, $Alq_3$:DMQd (DMQd: quinacridone derivative) formed as a light-emitting layer, $Alq_3$ formed as a electron transport layer, and LiF formed as an electron injection layer are sequentially laminated in the electroluminescent layer 502.

In FIG. 11D, the electroluminescent layer 502, the second electrode 503 made from a conductive transparent oxide material and silicon oxide, and the light-transmitting film 507 are sequentially laminated over the first electrode 501 which is a cathode.

LiF formed as an electron injection layer, $Alq_3$ formed as an electron transport layer, $Alq_3$:DMQd formed as a light-emitting layer, α-NPD formed as a hole transport layer, and CuPc formed as a hole injection layer are sequentially laminated in the electroluminescent layer 502. In addition, ITSO is used for the second electrode 503, and an insulating film comprising nitrogen and silicon, for example, silicon nitride and silicon nitride oxide is used for the light-transmitting film 507.

A conductive transparent oxide material and silicon oxide are used for an anode, and an insulating film comprising nitrogen and silicon, for example, silicon nitride and silicon nitride oxide is formed to be in contact with the electrode. Therefore, the extraction efficiency can be improved compared with the case of using the conventional light-emitting device, even when a light-emitting device of the present invention has the same aperture ratio as that of the conventional light-emitting device. As a result, high external quantum efficiency can be obtained.

On the other hand, FIGS. 11B and 11C are examples that ITSO typically used as an anode material is used for a cathode.

In FIG. 11B, the electroluminescent layer 502, the second electrode 503 made from a conductive transparent oxide material and silicon oxide, and the light-transmitting film 507 are sequentially laminated over the first electrode 501 which is an anode.

CuPc formed as a hole injection layer, α-NPD formed as a hole transport layer, $Alq_3$:DMQd formed as a light-emitting layer, $Alq_3$ formed as an electron transport layer, and BzOS:Li (BzOS: benzoxazole derivative) formed as an electron injection layer are sequentially laminated in the electroluminescent layer 502. In addition, ITSO is used for the second electrode 503, and an insulating film comprising nitrogen and silicon, for example, silicon nitride and silicon nitride oxide is used for the light-transmitting film 507.

In addition, in FIG. 11C, the first electrode 501 made from a conductive transparent oxide material and silicon oxide, the electroluminescent layer 502, and the second electrode 503 which is an anode are sequentially laminated over the light-transmitting film 507.

An insulating film comprising nitrogen and silicon, for example, silicon nitride and silicon nitride oxide is used for the light-transmitting film 507, and ITSO is used for the first electrode 501. In addition, BzOS:Li formed as an electron injection layer, $Alq_3$ formed as an electron transport layer, $Alq_3$:DMQd formed as a light-emitting layer, α-NPD formed as a hole transport layer, and CuPc formed as a hole injection layer are sequentially laminated in the electroluminescent layer 502.

ITSO is generally used for an anode material. When an anode material functions as a cathode as in FIGS. 11B and 11C, an electron injection layer may be mixed with Li or the like that is a cathode material.

According to the above-mentioned structure, the extraction efficiency can be improved compared with the case of using the conventional light-emitting device, even when a light-emitting device of the invention has the same aperture ratio as that of the conventional light-emitting device, even using a conductive transparent oxide material and silicon oxide for a cathode material just as the case where these materials are used as an anode. As a result, high external quantum efficiency can be obtained.

Note that the border of each layer is not always definite, and sometimes a material including each layer is partly mixed; therefore, the interface is unclear. In addition, an electrode material and a material used for a light-emitting layer are not limited to the above-mentioned compound.

This application is based on Japanese Patent Application serial no. 2003-361287 filed in Japanese Patent Office on Oct. 21, 2003, the contents of which are hereby incorporated by reference.

Although the present invention has been fully described by way of example with reference to the accompanying drawings, it is to be understood that various changes and modifications depart from the scope of the present invention hereinafter defined, they should be construed as being included therein.

What is claimed is:

1. A light-emitting device comprising:
a first electrode over a substrate;
an electroluminescent layer over the first electrode;
a second electrode over the electroluminescent layer;
a first inorganic insulating film over and in contact with the second electrode; and
a second inorganic insulating film over and in contact with the first inorganic insulating film,
wherein the first inorganic insulating film comprises nitrogen and silicon, and nitrogen is included at a concentration of 25 atom % or more, and
wherein the second electrode comprises a conductive transparent metal oxide and silicon oxide.

2. The light-emitting device according to claim 1, wherein the first inorganic insulating film further comprises oxygen, and a composition of the nitrogen is greater than a composition of the oxygen.

3. The light-emitting device according to claim 1, wherein the conductive transparent metal oxide is selected from zinc oxide, zinc oxide added with gallium, indium tin oxide, and indium zinc oxide.

4. The light-emitting device according to claim 1, wherein the substrate is a flexible substrate.

5. The light-emitting device according to claim 1, wherein the second inorganic insulating film comprises silicon nitride.

6. The light-emitting device according to claim 1, wherein the second inorganic insulating film is a laminated film of a carbon nitride film and a silicon nitride film.

7. The light-emitting device according to claim 1, wherein the electroluminescent layer comprises a phosphorescent material.

8. A light-emitting device comprising:
a first electrode over a substrate;
a partition layer over the first electrode, the partition layer having an opening overlapping with the first electrode;

an electroluminescent layer over and in contact with the first electrode;
a second electrode over the electroluminescent layer;
a first inorganic insulating film over and in contact with the second electrode; and
a second inorganic insulating film over and in contact with the first inorganic insulating film,
wherein the first inorganic insulating film comprises nitrogen and silicon, and nitrogen is included at a concentration of 25 atom % or more, and
wherein the second electrode comprises a conductive transparent metal oxide and silicon oxide.

9. The light-emitting device according to claim 8, wherein the first inorganic insulating film further comprises oxygen, and a composition of the nitrogen is greater than a composition of the oxygen.

10. The light-emitting device according to claim 8, wherein the conductive transparent metal oxide is selected from zinc oxide, zinc oxide added with gallium, indium tin oxide, and indium zinc oxide.

11. The light-emitting device according to claim 8, wherein the substrate is a flexible substrate.

12. The light-emitting device according to claim 8, wherein the second inorganic insulating film comprises silicon nitride.

13. The light-emitting device according to claim 8, wherein the second inorganic insulating film is a laminated film of a carbon nitride film and a silicon nitride film.

14. The light-emitting device according to claim 8, wherein the electroluminescent layer comprises a phosphorescent material.

15. The light-emitting device according to claim 8, wherein an area of an upper surface of the partition layer is larger than an area of a bottom surface of the partition layer.

16. The light-emitting device according to claim 8, wherein an area of an upper surface of the partition layer is smaller than an area of a bottom surface of the partition layer.

* * * * *